(12) United States Patent  
Kajigaya

(10) Patent No.: US 8,422,316 B2  
(45) Date of Patent: Apr. 16, 2013

(54) SEMICONDUCTOR DEVICE AND DATA PROCESSING SYSTEM

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 150 days.

(21) Appl. No.: 12/929,531

(22) Filed: Jan. 31, 2011

(65) Prior Publication Data

US 2011/0188325 A1 Aug. 4, 2011

(30) Foreign Application Priority Data

Feb. 2, 2010 (JP) ................................. 2010-021687

(51) Int. Cl.  
*G11C 5/14* (2006.01)

(52) U.S. Cl.  
USPC ............ 365/189.09; 365/189.15; 365/189.16; 365/191

(58) Field of Classification Search ............. 365/189.09, 365/189.15, 189.16, 191  
See application file for complete search history.

(56) References Cited

U.S. PATENT DOCUMENTS

| | | | | |
|---|---|---|---|---|
| 6,154,402 | A | 11/2000 | Akita | |
| 6,549,480 | B2 * | 4/2003 | Hosogane et al. | 365/226 |
| 6,594,187 | B2 | 7/2003 | Ito | |
| 7,542,367 | B2 * | 6/2009 | Matsufuji et al. | 365/225.7 |
| 7,933,141 | B2 * | 4/2011 | Kajigaya et al. | 365/149 |
| 8,189,413 | B2 * | 5/2012 | Yoshida | 365/201 |
| 8,199,559 | B2 * | 6/2012 | Kajigaya | 365/149 |
| 2009/0251947 | A1 | 10/2009 | Kajigaya | |
| 2009/0251948 | A1 | 10/2009 | Kajigaya et al. | |
| 2010/0054065 | A1 | 3/2010 | Kajigaya | |
| 2010/0061170 | A1 | 3/2010 | Kajigaya | |
| 2011/0063891 | A1 | 3/2011 | Kajigaya | |
| 2011/0063935 | A1 | 3/2011 | Yoshida | |

FOREIGN PATENT DOCUMENTS

| | | |
|---|---|---|
| JP | 11-16384 A | 1/1999 |
| JP | 2000-195268 A | 7/2000 |
| JP | 2002-157885 A | 5/2002 |
| JP | 2007-73121 A | 3/2007 |

OTHER PUBLICATIONS

S. Cosemans, W.Dehaene and F. Catthoor, "A 3.6 pJ/Access 480MHz, 128kb On-Chip SRAM With 850 MHz Boost Mode in 90nm CMOS With Tunable Sense Amplifiers,"IEEE J. Solid-State Circuits, vol. 44, Issue 7, pp. 2065-2077, Jul. 2009.

* cited by examiner

*Primary Examiner* — Pho M Luu  
(74) *Attorney, Agent, or Firm* — McGinn IP Law Group, PLLC

(57) ABSTRACT

A semiconductor device comprises a bit line transmitting a signal to be sensed, a single-ended sense amplifier sensing and amplifying the signal transmitted from the bit line to the input node, and a reference voltage supplying circuit outputting a reference voltage. The sense amplifier includes a first transistor for charge transfer between the bit line and an input node, and the voltage value of the reference voltage is controlled in association with a threshold voltage of the first transistor. The reference voltage is set to a first logical value of the transfer control signal which controlled to be first and second logical values.

30 Claims, 16 Drawing Sheets

RANDOM VARIATION DISTRIBUTION OF
THRESHOLD VOLTAGES Vt1 OF MOS TRANSISTORS Q1

SEMICONDUCTOR DEVICE AND DATA PROCESSING SYSTEM

BACKGROUND OF THE INVENTION

1. Field of the Invention

The present invention relates to a semiconductor device provided with a single-ended sense amplifier that senses data on a transmitted line, and particularly relates to a semiconductor device in which data stored in a memory cell is read out to a bit line and amplified by the single-ended sense amplifier.

2. Description of Related Art

In recent years, as miniaturization of memory cells has been advanced in semiconductor memory devices such as DRAM, it becomes difficult to obtain a sufficient capacitance of a capacitor included in each memory cell. Therefore, a sense amplifier capable of reliably amplifying a minute signal voltage readout from the memory cell is desired. For example, a charge transfer type sense amplifier is known as an example of the sense amplifier suitable for amplifying the minute signal voltage (for example, refer to the following Patent References 1 to 4). In general, a differential type sense amplifier is conventionally used, which is configured to receive the signal voltage of a bit line and a reference voltage respectively so as to perform a differential amplification.

The sense amplifier is configured by using field-effect transistors (for example, MOS transistors), and variation of threshold voltages of the MOS transistors needs to be considered in order to ensure a normal operation of the sense amplifier. In the semiconductor device, a decrease in size and an increase in capacity generally cause a tendency to increase a random variation distribution of threshold voltages of a large number of MOS transistors in a chip. Various proposals have been conventionally made concerning methods for compensating an offset due to unbalance of threshold voltages of a pair of MOS transistors in the above differential type sense amplifier. For example, the Non-Patent Reference 1 discloses an offset compensation technique for compensating an input offset (a potential offset of an input node) due to the random variation distribution of the threshold voltages of the MOS transistors in the chip by setting 16 kinds of reference voltages for each 32 sense amplifiers.

[Patent Reference 1] Japanese Patent Application Laid-open No. 2000-195268 (U.S. Pat. No. 6,154,402)
[Patent Reference 2] Japanese Patent Application Laid-open No. 2002-157885 (U.S. Pat. No. 6,594,187)
[Patent Reference 3] Japanese Patent Application Laid-open No. H11-16384
[Patent Reference 4] Japanese Patent Application Laid-open No. 2007-73121
[Non-Patent Reference 1] S. Cosemans, W. Dehaene and F. Catthoor, "A 3.6 pJ/Access 480 MHz, 128 kb On-Chip SRAM With 850 MHz Boost Mode in 90 nm CMOS With Tunable Sense Amplifiers," IEEE J. Solid-State Circuits, vol. 44, Issue 7, pp. 2065-2077, July 2009.

In general, it is more desirable to employ a single-ended sense amplifier to which the reference voltage is not required to be inputted than to employ the differential type sense amplifier from perspectives of a high density arrangement of memory cells and a reduction in circuit scale. However, the above conventional offset compensation technique associated with the random variation of the threshold voltages of transistors is adapted to the differential type sense amplifier (configured to have two input terminals, one of which is a first input terminal receiving signal data of a transmission line, and the other of which is a second input terminal receiving a reference signal for sensing), and cannot be adapted to the single-ended sense amplifier (configured to have one input terminal). This is because the single-ended sense amplifier does not have a terminal supplied with the reference voltage directly associated with a sense node of the sense amplifier. Further, the Non-Patent Reference 1 discloses a method applied to a configuration in which a relatively small number (32) of sense amplifiers are arranged in a semiconductor memory, and the method optimizes the reference voltage for each sense amplifier, which cannot be adapted to a configuration in which a large number of sense amplifiers are arranged in the semiconductor device such as a large capacity DRAM. As described above, in case of configuring a semiconductor device by employing the single-ended sense amplifiers, there has not been proposed a method to effectively prevent a performance deterioration of the sense amplifier due to the variation distribution of the threshold voltages of field-effect transistors (for example, MOS transistors).

SUMMARY

The present invention seeks to solve one or more of the above problems, or to improve upon those problems at least in part.

One of aspects of the invention is a semiconductor device comprising: a bit line transmitting a signal to be sensed; a single-ended sense amplifier including a first transistor controlling charge transfer between the bit line and an input node in response to a transfer control signal applied to a gate thereof, the sense amplifier sensing and amplifying the signal transmitted from the bit line to the input node; and a reference voltage supplying circuit outputting a reference voltage having a voltage value controlled in association with a threshold voltage of the first transistor, the reference voltage being set to a first logical value of the transfer control signal controlled to be first and second logical values in association with an operation of the semiconductor device.

Another aspect of the invention is a semiconductor device comprising: a sense amplifier having first to fourth nodes and including a first transistor electrically switching between the first and second nodes in response to a potential of a transfer control signal and a second transistor electrically switching between the third and fourth nodes in response to a potential of the second node; a first circuit generating the transfer control signal having first and second logical values in association with an operation of the semiconductor device; and a second circuit controlling a potential the first logical value in association with a threshold voltage of the first transistor, the second circuit outputting the potential to the first circuit.

According to the semiconductor device of the invention, for example, the first transistor of the single-ended sense amplifier functions as a charge transfer switch between the bit line and the input node of the sense amplifier, and by controlling the potential of the transfer control signal applied to its gate, it is possible to prevent an operation failure due to a variation distribution of the threshold voltage of the first transistor. In this case, a plurality of reference voltages associated with the variation distribution of the threshold voltage are provided, one reference voltage suitable for a predetermined number of the sense amplifiers is selected among them, and control is performed so that the selected reference voltage is used as the potential of the transfer control signal in an activated state. Thus, sensing margin for the predetermined number of the sense amplifiers can be optimized, and the operating failure due to the variation distribution of the threshold voltage can be prevented.

The present invention can be applied to a data processing system comprising the semiconductor device and a controller connected to the semiconductor device through a bus. The controller processes data stored in the semiconductor device and controls operations of the system as a whole and an operation of the semiconductor device.

As described above, the present invention is applied to a semiconductor device such as DRAM in which a large number of transmission lines and corresponding sense amplifiers are provided. When a single-ended sense amplifier is employed in the semiconductor device, in consideration of the variation distribution of the threshold voltage of the first transistor as the charge transfer switch of the sense amplifier, the reference voltage applied to the gate of the first transistor is controlled within a range of a predetermined voltage width (for example, the potential of the transfer controls signals is controlled in accordance with a reference voltage selected among the plurality of reference voltages). Therefore, the operation failure due to the variation distribution of the threshold voltage of the first transistor is prevented by the controlled reference voltage, thereby obtaining excellent sensing margin. Further, even when the variation distribution of the first transistor of the sense amplifier increases in the chip due to a decrease in size and an increase in capacity of the semiconductor device such as DRAM, it is possible to effectively prevent a decrease in sensing margin.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, It goes without saying that the present invention is not limited to the example of the technical idea and should be construed based on the disclosure of the claims.

An example of the technical idea of the invention is applied to a predetermined number of single-ended sense amplifiers (for example, one sense amplifier row) included in a semiconductor device, in which the potential of a transfer control signal in an activated state applied to the gate of a first transistor for charge transfer of a sensed signal between a bit line as a transmission line and an input node of the sense amplifier is controlled within a range of a predetermined voltage width (controlled to be a reference voltage selected among a plurality of reference voltages). Since the plurality of reference voltages are set corresponding to a variation distribution of the threshold voltage of the first MOS transistor, a reference voltage can be selected to obtain excellent sensing margin of the sense amplifier, thereby preventing an operating failure of the sense amplifier due to the variation distribution of the threshold voltage.

The following U.S. patent applications are hereby incorporated by reference in its entirety as though fully and completely set forth herein.

(1) U.S. patent application Ser. No. 12/461,858 filed Aug. 26, 2009 entitled "SENSE AMPLIFIER CIRCUIT AND SEMICONDUCTOR MEMORY DEVICE", whose inventor is Kazuhiko Kajigaya.

(2) U.S. patent application Ser. No. 12/881,788 filed Sep. 14, 2010 entitled "SEMICONDUCTOR DEVICE, SEMICONDUCTOR MEMORY DEVICE AND DATA PROCESSING SYSTEM COMPRISING SEMICONDUCTOR SYSTEM", whose inventor is Kazuhiko Kajigaya.

(3) U.S. patent application Ser. No. 12/881,750 filed Sep. 14, 2010 entitled "SEMICONDUCTOR DEVICE AND DATA PROCESSING SYSTEM COMPRISING SEMICONDUCTOR DEVICE", whose inventors are Soichiro Yoshida, Kazuhiko Kajigaya and Yasutoshi Yamada.

(4) U.S. patent application Ser. No. 12/416,432 filed Apr. 1, 2009 entitled "SEMICONDUCTOR MEMORY DEVICE", whose inventors are Kazuhiko Kajigaya, Soichiro Yoshida, Tomonori Sekiguchi, Riichiro Takemura and Yasutoshi Yamada.

(5) U.S. patent application Ser. No. 12/382,493 filed Mar. 17, 2009 entitled "SEMICONDUCTOR DEVICE HAVING SINGLE-ENDED SENSING AMPLIFIER", whose inventor is Kazuhiko Kajigaya.

(6) U.S. patent application Ser. No. 12/461,859 filed Aug. 26, 2009 entitled "SENSE AMPLIFIER CIRCUIT AND SEMICONDUCTOR MEMORY DEVICE", whose inventor is Kazuhiko Kajigaya Preferred embodiments of the invention will be described in detail below with reference to accompanying drawings. In the following embodiments, the present invention is applied to DRAM (Dynamic Random Access Memory) as an example of the semiconductor device.

Figure 1:
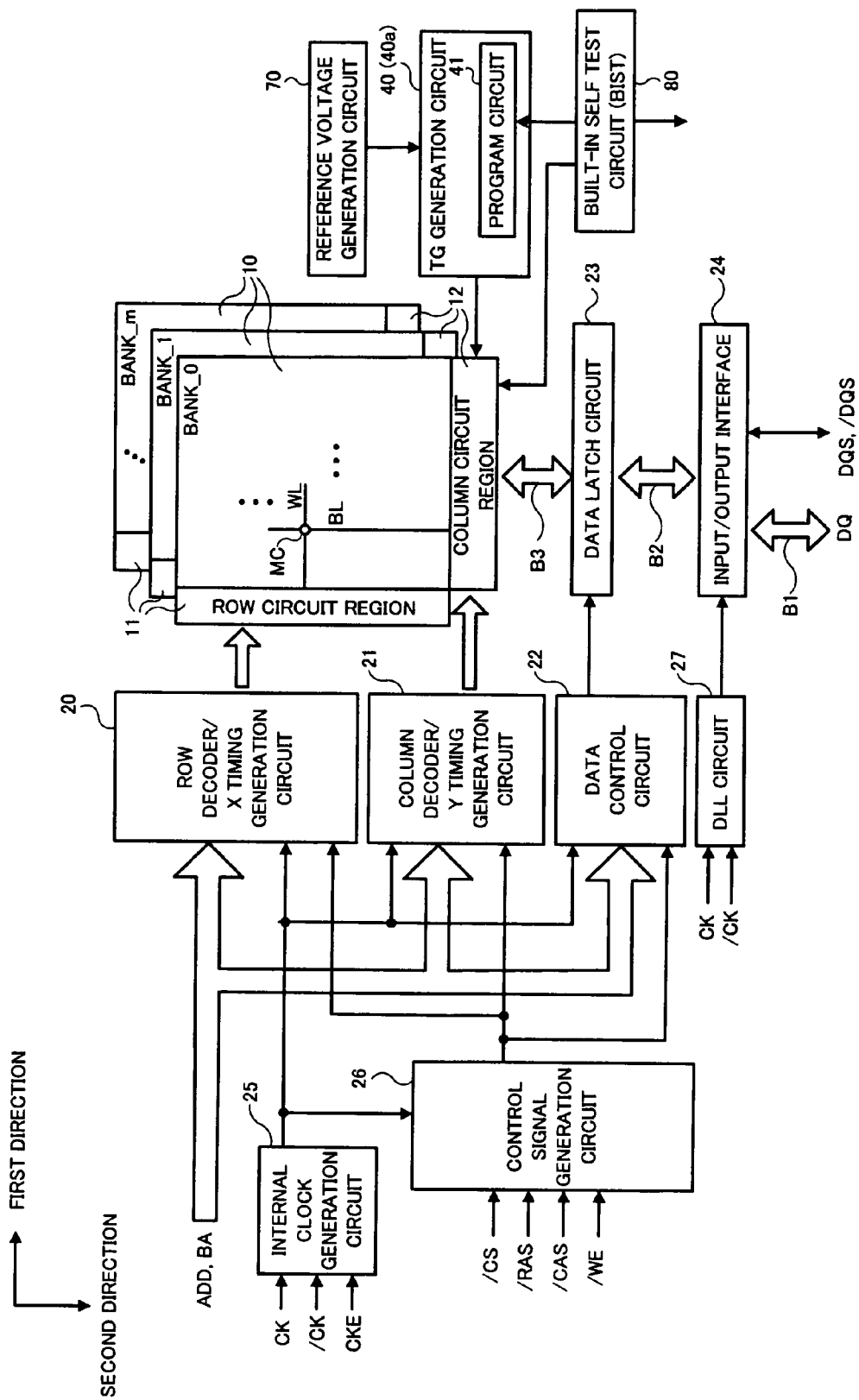
FIG. 1 is a block diagram showing an entire configuration of DRAM of an embodiment.

FIG. 1 is a block diagram showing an entire configuration of the DRAM of an embodiment. The DRAM shown in FIG.

1 includes a memory cell array region 10 partitioned into a plurality of banks, a row circuit region 11 and a column circuit region 12 respectively attached to each bank. In addition, m+1 (m is an integer) banks (BANK_0 to BANK_m) are provided in the example of FIG. 1. Further, the DRAM shown in FIG. 1 includes a row decoder/X timing generation circuit 20, a column decoder/Y timing generation circuit 21, a data control circuit 22, a data latch circuit 23, an input/output interface 24, an internal clock generation circuit 25, a control signal generation circuit 26, a DLL (Delay Locked Loop) circuit 27, a TG generation circuit 40 (40a), a program circuit 41, a reference voltage generation circuit 70, and a built-in self test circuit (BIST) 80.

In the memory cell array region 10, a plurality of memory cells MC are formed at intersections of a plurality of word lines WL and a plurality of bit lines BL. The plurality of bit lines BL are aligned in an extending direction of the word lines WL (first direction). The plurality of word lines WL are aligned in an extending direction of the bit lines BL (second direction). A large number of sub-word driver circuits (not shown) driving the word lines WL and the like are provided in the row circuit region 11. As described later, sense amplifier rows each including a large number of sense amplifiers and the like are provided in the column circuit region 12.

The memory cell array region 10 is connected to the data latch circuit 23 via a bus B3 for data transfer. The data latch circuit 23 is connected to the input/output interface 24 via a bus B2 for data transfer. The input/output interface 24 inputs/outputs data (DQ) and data strobe signals DQS and /DQS from/to the outside via a bus B1 for data transfer. The data transfers through the buses B1, B2 and B3 are controlled by the data control circuit 22, and output timing of the input/output interface 24 is controlled by the DLL circuit 27 to which external clock signals CK and /CK are supplied. Further, the row decoder/X timing generation circuit 20 controls circuits in the row circuit region 12 of each bank, and the column decoder/Y timing generation circuit 21 controls circuits in the column circuit region 12 of each bank.

The internal clock generation circuit 25 generates internal clocks based on the external clock signals CK, /CK and a clock enable signal CKE, and supplies them to various parts of the DRAM. The control signal generation circuit 26 generates control signals based on external signals including a chip select signal /CS, a row address strobe signal /RAS, a column address strobe signal /CAS and a write enable signal /WE, and supplies them to various parts of the DRAM. In addition, an address ADD and a bank address BA are externally supplied to the row decoder/X timing generation circuit 20, the column decoder/Y timing generation circuit 21 and the data control circuit 22.

The reference voltage generation circuit 70 is a circuit that generates a reference voltage to be applied to a gate of a transistor transferring charge to an input node (input gate terminal) of the single-ended sense amplifier for a signal to be sensed and supplies the reference voltage to the TG generation circuit 40.

The TG generation circuit 40 is a circuit that generates a signal applied to the gate of the transistor for charge transfer and outputs the signal to the column circuit region 12 including the sense amplifiers, and functionally generates HIGH data (first logical value) and LOW data (second logical value) based on the signal corresponding to sensing operation of the semiconductor device. Further, the TG generation circuit 40 controls a potential of a signal associated with the first logical value.

The program circuit 41 stores information for determining the potential to which the first logical value is set to.

The built-in self test circuit (BIST) 80 has a function to perform self-tests of the semiconductor device. Further, the built-in self test circuit 80 has a function to calculate the information stored in the program circuit 41 based on test results. The built-in self test circuit 80 generates signals having well known address pattern and data pattern, and also generates internal control signals. These signals are outputted to the row decoder/X timing generation circuit 20, the column decoder/Y timing generation circuit 21, the data control circuit 22, the data latch circuit 23, the input/output interface 24, the internal clock generation circuit 25 and the control signal generation circuit 26.

Figure 2:
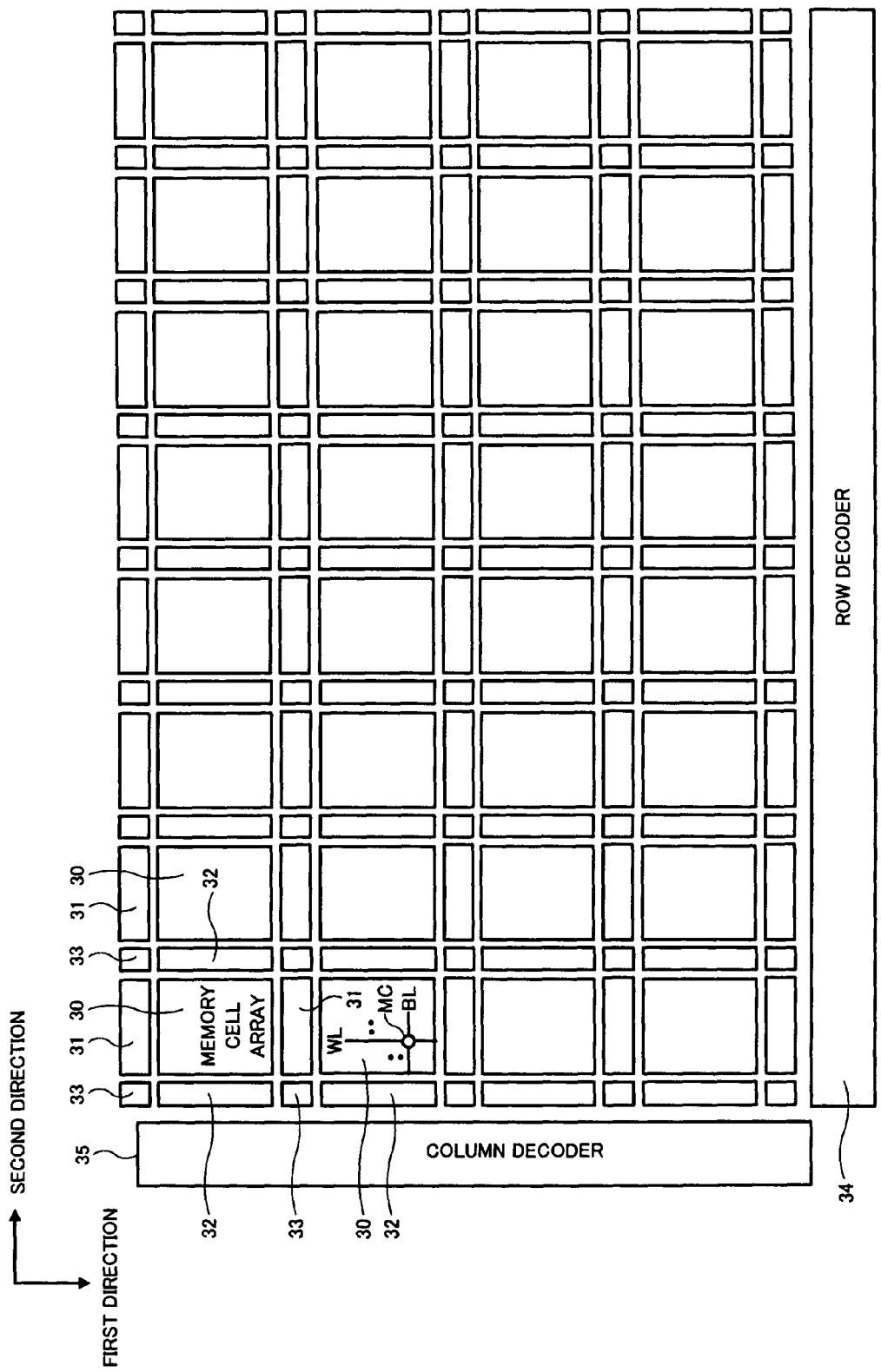
FIG. 2 is a block diagram showing a configuration of a memory cell array region and its peripheral region in the DRAM of the embodiment.

FIG. 2 is a block diagram showing a configuration of the memory cell array region 10 and its peripheral region in the DRAM of FIG. 1. In FIG. 2, a plurality of memory cell arrays 30 are arranged in a matrix form, and a plurality of sub-word drivers 31, a plurality of sense amplifier rows 32 and a plurality of sense amplifier driving circuits 33 are respectively arranged around the memory cell arrays 30. Further, a column decoder 35 is arranged in a left part of FIG. 2, and a row decoder 34 is arranged in a lower part of FIG. 2. In the example of FIG. 2, each four of the memory cell arrays 30 are aligned in a word line extending direction (first direction), each eight thereof are aligned in a bit line extending direction (second direction), and 32 (4×8) memory cell arrays 30 in total are arranged. Further, the sub-word drivers 31 are arranged on both sides in the word line extending direction, and the sense amplifier rows 32 are arranged on both sides in the bit line extending direction, respectively, for each of the memory cell arrays 30. Each of the sense amplifier driving circuit 33 is arranged in a region surrounded by the sub-word driver 31 and the sense amplifier row 32. A unit of one block is defined by the sense amplifier row 32 including the plurality of bit lines BL aligned in the first direction and the plurality of sense amplifiers corresponding to the bit lines BL.

In each of the memory cell arrays 30 in the above configuration, the plurality of memory cells MC are formed at intersections of the plurality of word lines WL and the plurality of bit lines BL. The row decoder 34 selects a main word line (not shown) corresponding to a row address, and the column decoder 35 selects a bit line BL corresponding to a column address. Each of the sub-word drivers 31 selects one sub-word line (word line WL) based on the selected main word line and a lower row address. In each of the sense amplifier rows 32, a predetermined number of sense amplifiers SA (FIG. 3) connected to respective bit lines BL of adjacent memory cell arrays 30 are aligned in the word line extending direction. For example, 1024 sense amplifiers SA are arranged in each of sense amplifier rows 32 except two sense amplifier rows 32 at both ends of FIG. 2. In this case, 32 memory cell arrays 30 of FIG. 2 include 32768 sense amplifiers SA in total. In addition, configuration and operation of the sense amplifier driving circuit 33 will be described later.

Figure 3:
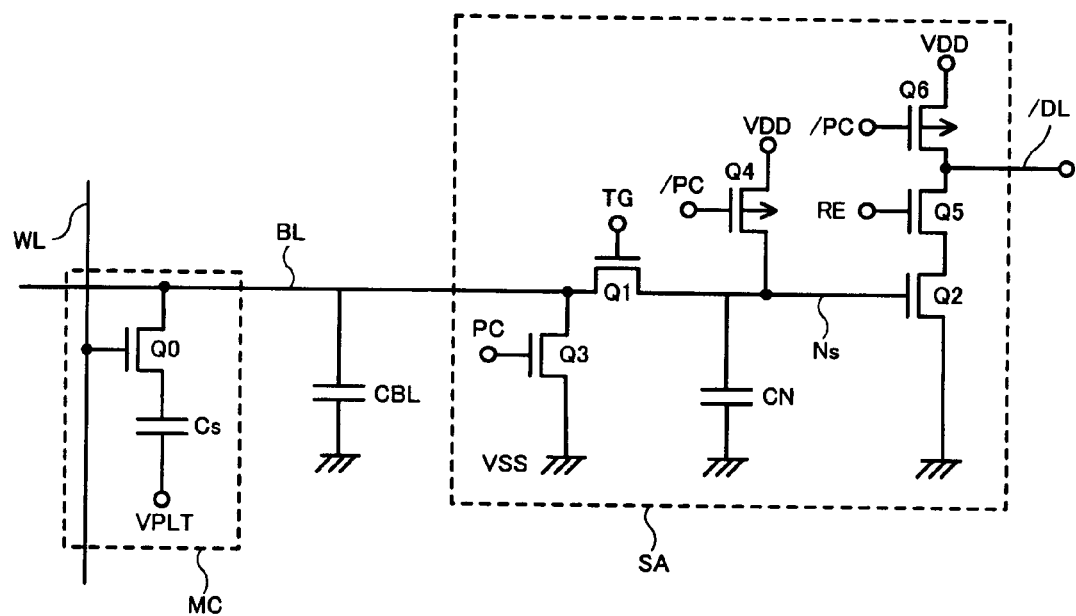
FIG. 3 is a diagram showing a diagram showing a circuit configuration of a sense amplifier in a sense amplifier row of FIG. 2 and its peripheral portion.

Next, specific circuit configuration and operation of each sense amplifier SA included in the sense amplifier row 32 of FIG. 2 will be described with reference to FIGS. 3 to 6. FIG. 3 is a diagram showing a circuit configuration of the sense amplifier SA and its peripheral portion, in which one memory cell MC and one sense amplifier SA connected to the memory cell MC via the bit line BL are shown. The memory cell MC is a 1T1C type memory cell composed of an NMOS-type select transistor Q0 and a capacitor Cs storing data as electric charge. The select transistor Q0 has a source connected to the bit line BL and a gate connected to the word line WL. The capacitor Cs is connected between a drain of the select transistor Q0 and a plate voltage VPLT. Further, a bit line capacitance CBL is formed at the bit line BL. The bit line capacitance CBL is determined depending on a parasitic capacitance of the bit line BL and the number of connected memory cells MC.

The sense amplifier SA is a single-ended sense amplifier including N-type MOS transistors Q1, Q3, Q2, Q5 and P-type MOS transistors Q4, Q6. The MOS transistor Q1 (the first MOS transistor of the invention) functions as a charge transfer switch and controls connection between the bit line BL and a sense node Ns (gate of the MOS transistor Q2) that is the input node of the sense amplifier SA in response to a transfer control signal TG applied to the gate of the MOS transistor Q1. In addition, a capacitance CN is formed at the sense node Ns. The transistor Q3 (the third transistor of the invention) functions as a precharge circuit of the bit line BL, which is connected between the bit line BL and a grand potential VSS and precharges the bit line BL to the grand potential VSS in response to a precharge signal PC applied to the gate of the transistor Q3. The transistor Q4 (the fourth transistor of the invention) functions as a precharge circuit of the sense node Ns, which is connected between the sense node Ns and a power supply voltage VDD, and precharges the sense node Ns to the power supply voltage VDD in response to a precharge signal /PC applied to the gate of the transistor Q4. The precharge signal /PC is controlled with a polarity reverse to that of the precharge signal PC. If the transistors Q4 and Q6 are N-type MOS transistors, their gates are controlled with the precharge signal PC. It can be understood that the precharge signal PC is an equalizing signal.

Further, the MOS transistors Q2, Q5 and Q6 are connected in series between the power supply voltage VDD and the grand potential VSS. The gate of the MOS transistor Q2 (the second transistor of the invention) for sensing and amplification is connected to the sense node Ns, and the MOS transistor Q2 is turned ON/OFF in response to the potential of the sense node Ns. The transistor Q5 (the fifth transistor of the invention) functions as a read control switch and controls connection between the transistor Q2 and an output node /DL (output terminal of the sense amplifier SA) in response to a read control signal RE applied to its gate. The transistor Q6 functions as a precharge circuit of the output node /DL and precharges the output node /DL to the power supply voltage VDD in response to the precharge signal /PC applied to its gate. The power supply voltage VDD supplied to the transistor Q6 may have a voltage value different from that of the power supply voltage VDD supplied to the transistor Q4. Positions of the transistors Q2 and Q5 may be replaced with each other.

In addition, various circuits for performing writing/restoring of the memory cells MC are actually disposed around the sense amplifiers SA, which are not directly associated with the present invention and are not shown in the figures.

Figure 4:
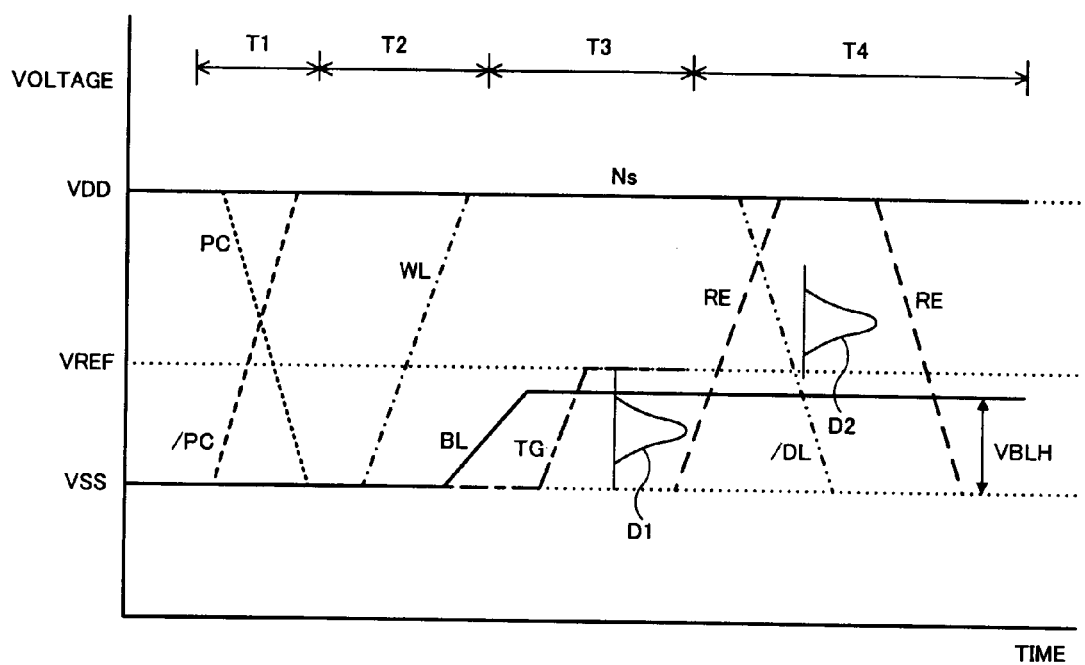
FIG. 4 is a diagram showing operation waveforms in case of reading HIGH data of a memory cell in the sense amplifier of FIG. 3.
Figure 5:
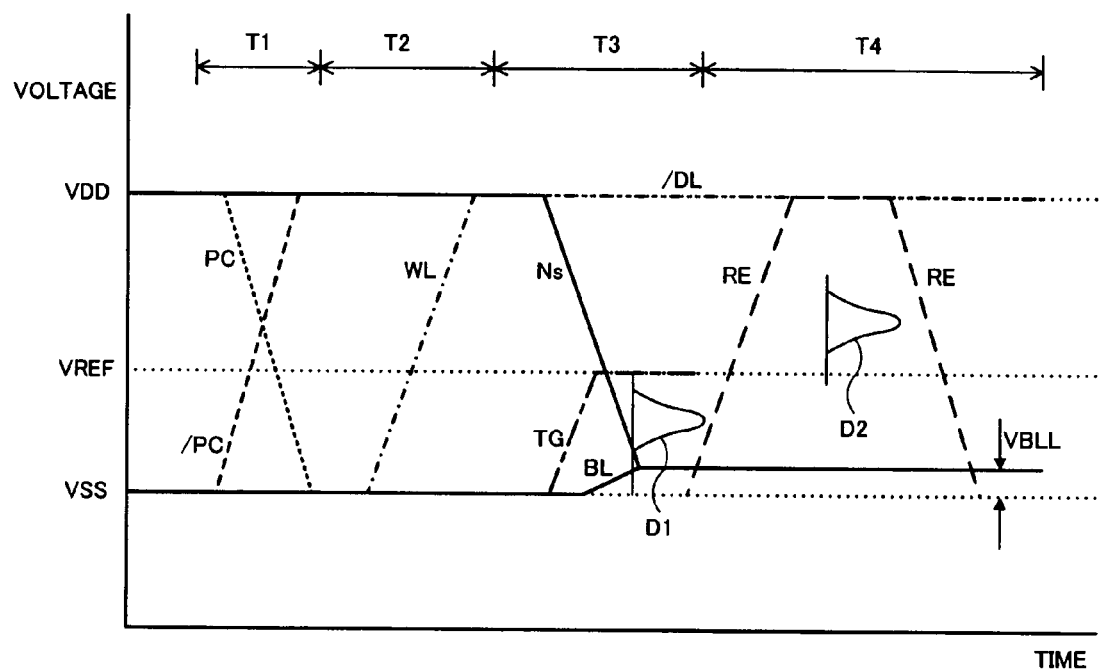
FIG. 5 is a diagram showing operation waveforms in case of reading LOW data of a memory cell in the sense amplifier of FIG. 3.

Next, a read operation of data stored in the memory cell MC in the sense amplifier SA of FIG. 3 will be described with reference to FIGS. 4 and 5. FIG. 4 shows operation waveforms in case of reading HIGH data of the memory cell MC in the sense amplifier SA, and FIG. 5 shows operation waveforms in case of reading LOW data of the memory cell MC in the sense amplifier SA. As shown in upper parts of FIGS. 4 and 5, the entire read operation is divided into four periods (T1 to T4).

First, during the period T1, the precharge signal PC is changed from HIGH to LOW, and the precharge signal /PC is changed from LOW to HIGH. Thereby, the bit line BL becomes floating in a state of being precharged to the grand potential VSS, and the output node /DL becomes floating in a state of being precharged to the power supply voltage VDD. Subsequently, during the period T2, the word line WL is driven to the power supply voltage VDD so that the select transistor Q0 turns ON, and the HIGH data of the memory cell MC is read out to the bit line BL. As a result, the potential of the bit line BL rises to a voltage VBLH shown in FIG. 4.

Subsequently, during the period T3, the transfer control signal TG applied to the gate of the MOS transistor Q1 is changed from the grand potential VSS as the low potential (the second logical value) to a reference voltage VREF as a high potential (the first logical value). At this point, if the voltage VBLH of the bit line BL is higher than the upper limit of a distribution of a value obtained by subtracting a threshold voltage distribution D1 of the MOS transistor Q1 from the reference voltage VREF, the MOS transistor Q1 remains OFF, and the potential of the sense node Ns is maintained at the power supply voltage VDD. Here, the distribution D1 shown in FIG. 4 represents a random variation distribution of threshold voltages Vt1 of the MOS transistors Q1, the number of which is included in a single chip (for example, 32768 MOS transistors Q1), and this distribution D1 is generally known to be a normal distribution.

Subsequently, during the period T4, the read control signal RE is maintained at HIGH for a certain period, and thereby the MOS transistor Q5 turns ON. At this point, the gate voltage of the MOS transistor Q2 is maintained at the power supply voltage VDD, and thus it is higher than the upper limit of a threshold voltage distribution D2 of the MOS transistor Q2. Therefore, the MOS transistor Q2 is turned ON, the potential of the output node /DL is decreased from the power supply voltage VDD to the grand potential VSS, and inverted data in reading the HIGH data is outputted from the output node /DL.

Meanwhile, when reading LOW data in the sense amplifier SA, the operation waveforms shown in FIG. 5 are obtained. First, operation waveforms during the period T1 are the same as those in FIG. 4. Subsequently, during the period T2, the word line WL is driven to the power supply voltage VDD so that the select transistor Q0 turns ON, and the LOW data of the memory cell MC is read out to the bit line BL. The potential of the bit line BL in this case is maintained at the grand potential VSS.

Subsequently, during the period T3, the above transfer control signal TG is changed to the reference voltage VREF. At this point, if the grand potential VSS of the bit line BL is lower than the lower limit of a distribution of a value obtained by subtracting the threshold voltage distribution D1 of the MOS transistor Q1 from the reference voltage VREF, the MOS transistor Q1 turns ON, and charge is moved by charge sharing. Specifically, the charge stored in the capacitance CN at the sense node Ns is transferred to the bit line capacitance CBL and the capacitor Cs of the memory cell MC. In general, a relation CBL+Cs>>CN is satisfied, and thus the potential of the bit line BL slightly increases and becomes a voltage VBLL, reflecting the relation, as shown in FIG. 5. The voltage VBLL is desired to be lower than the lower limit of the distribution of the value obtained by subtracting the threshold voltage distribution D1 of the MOS transistor Q1 from the reference voltage VREF. This is a condition for the above charge sharing to be completely performed, and the potential of the sense node Ns becomes equal to the potential of the bit line BL in this case.

Subsequently, during the period T4, the read control signal RE is maintained at HIGH for a certain period, and thereby the MOS transistor Q5 turns ON. At this point, the gate voltage of the MOS transistor Q2 is maintained at the voltage VBLL, and thus it is lower than the lower limit of the threshold voltage distribution D2 of the MOS transistor Q2. Therefore, the MOS transistor Q2 continues to remain OFF, the potential of the output node /DL is maintained at the power supply voltage VDD, and inverted data in reading the LOW data is outputted from the output node /DL.

In FIGS. 4 and 5, since the above voltages VBLH and VBLL of the bit line BL are lower than the power supply voltage VDD, the threshold voltage distribution D1 of the MOS transistor Q1 strongly affects the control to turn on/off the MOS transistor Q1. Therefore, the value of the reference voltage VREF is generally set so that the center of a normal distribution that is the variation distribution of the threshold voltage Vt1 becomes an intermediate value between the voltages VBLH and VBLL. By this setting, it is possible to maximize the probability that the HIGH/LOW data is properly determined by the sense amplifier SA. Meanwhile, since a difference between HIGH and LOW levels at the sense node Ns becomes a large value VDD-VBLL, it is possible to obtain a sufficient margin for the threshold voltage distribution D2 of the MOS transistor Q2.

Figure 6:
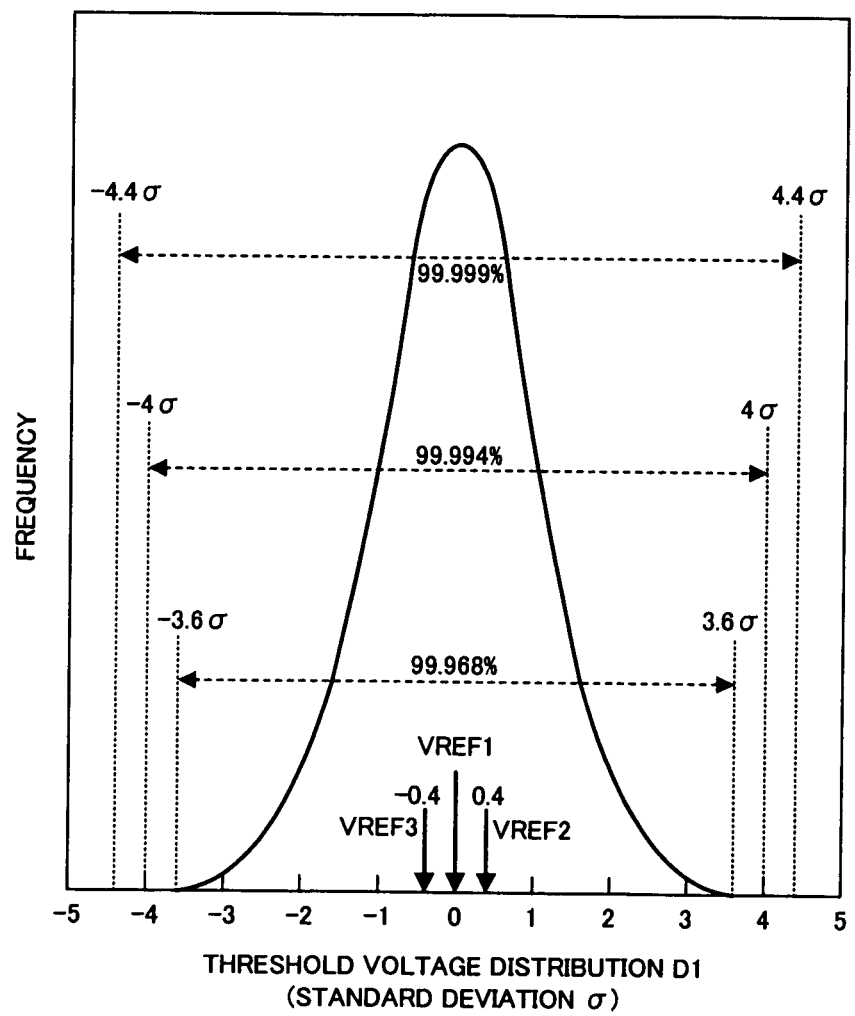
FIG. 6 is a diagram showing a variation distribution of threshold voltages Vt1 of MOS transistors Q1.

FIG. 6 is a graph representing the normal distribution that is the random variation distribution of the threshold voltages Vt1 of the MOS transistors Q1. In FIG. 6, the horizontal axis represents values to which the threshold voltage distribution D1 of the MOS transistors Q1 is normalized by a standard deviation σ, and the vertical axis represents frequencies. Three kinds of ranges of the horizontal axis are shown in FIG. 6, which are ±3.6σ, ±4σ, ±4.4σ. Here, 32768 sense amplifiers SA (and the same number of the MOS transistors Q1) are assumed to exist in a chip, as described above. Thus, if ±4.4σ (99.999%) is selected among the above ranges, all the threshold voltages Vt1 of the MOS transistors Q1 will be stochastically within the range. Thus, if a difference between the two voltages VBLH and VBLL of FIGS. 4 and 5 is larger than 4.4σ, all the sense amplifiers SA properly operate, and however this requires sufficient amount of the signal. The amount of the read signal decreases due to a reduction in capacitance of the capacitor Cs with miniaturization of the DRAM, and since the standard deviation σ increases in this case, it is difficult to operate the sense amplifiers SA within the range of σ=±4.4.

In the DRAM of the embodiment, the sense amplifiers SA are assumed to be operated within a range narrower than ±4.4σ (for example, a range of ±4σ). As shown in FIG. 6, regarding 32766 (99.994%) sense amplifiers SA among 32768 sense amplifiers SA (MOS transistors Q1), the threshold voltages Vt1 thereof are within the range of ±4σ and residual two threshold voltages Vt1 are outside the range of ±4σ. Here, a reference voltage VREF1 corresponding to the center (0σ) of the threshold voltage distribution D1, a reference voltage VREF2 corresponding to a value (+0.4σ) higher than the center by 0.4σ, and a reference voltage VREF3 corresponding to a value (−0.4σ) lower than the center by 0.4σ are respectively given. In this case, the reference voltage VREF2 corresponds to a case where the above two values for the two sense amplifiers SA are deviated downward, and the reference voltage VREF3 corresponds to a case where the above two values for the two sense amplifiers SA are deviated upward.

In the embodiment, a control is performed so that the three reference voltages VREF1, VREF2 and VREF3 can be independently selected for each unit of 1024 sense amplifiers SA. Considering the threshold voltage distribution D1 of the unit of 1024 sense amplifiers SA, it is understood that all the sense amplifiers SA among the unit of 1024 sense amplifiers (the same number of the MOS transistors Q1) are within the range of ±3.6σ with high probability (99.968%), as shown in FIG. 6. Therefore, when the reference voltage VREF2 is supplied to the sense amplifier row 32 (the unit of 1024 sense amplifiers SA) including the MOS transistors Q1 whose threshold voltages Vt1 are deviated upward, a range to be properly operated is shifted to a range from −3.6σ to +4.4σ. In this case, the threshold voltages Vt1 of all the 1024 sense amplifiers SA including residual 1023 sense amplifiers SA (the same number of the MOS transistors Q1) are within the above shifted range with high probability. This is because a probability that the threshold voltages Vt1 of two among the 1024 MOS transistors Q1 are outside the range of ±3.6σ is very low. Similarly, when the threshold voltages Vt1 are deviated downward, the range to be properly operated may be shifted to a range from −4.4σ to +3.6σ by supplying the reference voltage VREF3. Here, the embodiment has shown one setting example, and without being limited to this example, the present invention can be applied to settings where the number of the sense amplifiers SA as the unit, a value of the standard deviation σ, voltage values of the voltages VBLH and VBLL are freely set. These settings can be estimated by calculating the distribution of the plurality of the transistors Q1 based on a plurality of test results obtained by comparing measured values with corresponding expected values when the plurality of sense amplifiers SA are operated. Based on the calculated result, it is possible to understand how the reference voltage VREF should be shifted. This calculation is made by an external tester or the built-in self test circuit (BIST) 80.

In the embodiment, although the case has been described in which the 1024 sense amplifiers SA as the unit for selecting the reference voltage VREF correspond to the sense amplifier row 32, an arbitrary number of sense amplifiers SA may be used to select the reference voltage VREF independently of other sense amplifiers SA without corresponding to the sense amplifier row 32. For example, the sense amplifiers SA may correspond to four sense amplifier rows 32 (4096 sense amplifiers SA) aligned in the first direction. Or, the sense amplifiers SA may correspond to two sense amplifier rows 32 (2048 sense amplifiers SA) sandwiching one memory cell array 30. In these cases, a unit of a memory block that includes a predetermined number of sense amplifiers SA as the unit for selection and the memory cell array 30 including a plurality of bit lines BL connected to the sense amplifiers SA may be configured and the entire semiconductor device can be achieved by repeatedly arranging the memory blocks.

Figure 7:
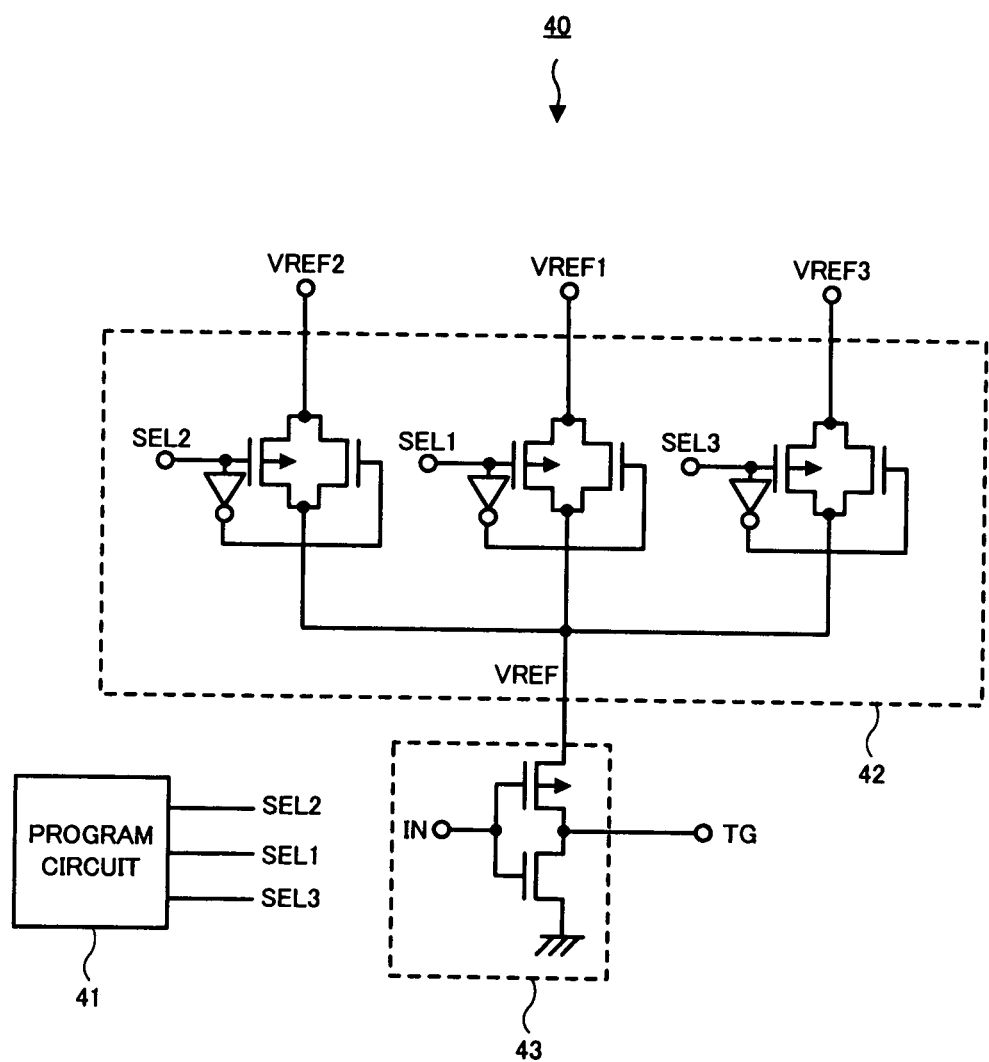
FIG. 7 is a diagram showing a configuration example of a TG generation circuit of the DRAM of the embodiment.

Next, FIG. 7 shows a configuration example of the TG generation circuit 40 generating the transfer control signal TG applied to gates of the MOS transistors Q1. The TG generation circuit 40 is included in the sense amplifier driving circuit 33 of FIG. 2 and supplies the transfer control signal TG to 1024 sense amplifiers SA included in an adjacent sense amplifier row 32. As shown in FIG. 7, the TG generation circuit 40 includes a program circuit 41, a select circuit 42 (the reference voltage select circuit: the second circuit) and an output circuit 43 (the reference voltage supplying circuit: the first circuit).

Figure 16:
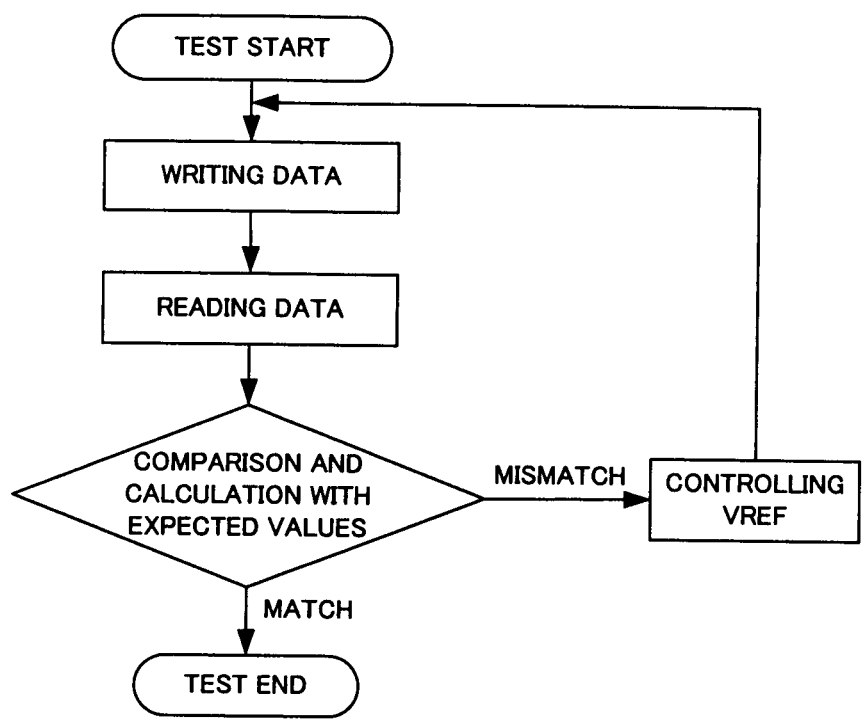
FIG. 16 is a flow chart showing a test flow of the DRAM of the embodiment.

The three reference voltages VREF1, VREF2 and VREF3 shown in FIG. 7 are outputted from the reference voltage generation circuit 70 (FIG. 8) as described later, and are inputted to the select circuit 42. The program circuit 41 is used to store information for selecting a desired reference voltage among the reference voltages VREF1, VREF2 and VREF3 and outputs select signals SEL1, SEL2, SEL3 that are activated in accordance with the selection result of the reference voltages VREF1, VRER2 and VREF3. In one example of selection methods in this case, for example, writing of HIGH and LOW data, reading of HIGH and LOW data, and comparison of the data with the expected values are respectively performed for all the memory cells MC, as shown in FIG. 16. Then, regarding the sense amplifier row 32 corresponding to the memory cell array 30 including the memory cell MC that is determined to have a failure due to mismatch between the data and the expected values, the reference voltage VREF3 may be selected when the failure is associated with the reading of the HIGH data, and the reference voltage VREF2 may be selected when the failure is associated with the reading of the LOW data. Specifically, the comparison results for all the sense amplifiers SA are read out, a plurality of the comparison results are calculated for each sense amplifier row 32, and a condition of the selection is determined for each sense amplifier row 32. These reading and calculation (estimation of the distribution of the plurality of the transistors Q1) can be performed by the external tester or the built-in self test circuit (BIST) 80 in the semiconductor device. Further, the calculation may be processed as one comparison result for one sense amplifier row 32. Various program methods in the program circuit 41 can be employed, which include, for example, a method of cutting fuse elements by a laser, and a method of electrical destruction of anti-fuse elements. When using the built-in self test circuit (BIST) 80, it is desirable to employ the electrical destruction of anti-fuse elements. This effect based on the technical idea of the invention is valid for a test of at least one sense amplifier SA.

The select circuit 42 includes three groups of switch circuits connected to the three reference voltages VREF1, VREF2 and VREF3, and the respective switch circuits is selected in response to the select signals SEL1, SEL2 and SEL3. Each of the switch circuits is composed of a pair of P- and N-type MOS transistors connected in parallel and an inverter inverting polarities of gates of the MOS transistors. The reference voltage VREF from the select circuit 42 is inputted to one end of the output circuit 43, and the transfer control signal TG is outputted from the output circuit 43. The output circuit 43 is composed of a pair of P- and N-type MOS transistors, an input signal IN is applied to each gate of the MOS transistors, and the transfer control signal TG is outputted from each drain thereof. Thereby, the potential of the transfer control signal TG in an activated state is controlled to be the above reference voltage VREF (high level).

Figure 8:
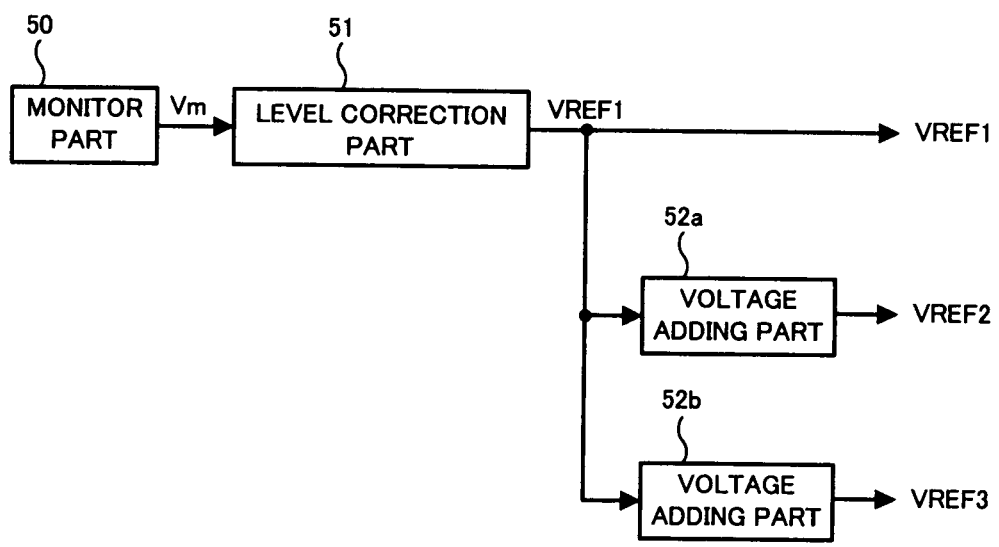
FIG. 8 is a block diagram showing a configuration example of a reference voltage generation circuit of the DRAM of the embodiment.

In the following, configuration and operation of the reference voltage generation circuit 70 generating the above reference voltages VREF1, VREF2 and VREF3. FIG. 8 is a block diagram showing a configuration example of the reference voltage generation circuit 70. The reference voltage generation circuit 70 shown in FIG. 8 includes a monitor part 50 that monitors the threshold voltage Vt1 of the MOS transistor Q1 and generates a monitor voltage Vm, a level correction part 51 that corrects the level of the monitor voltage Vm from the monitor part 50 and generates the reference voltage VREF1, and voltage adding parts 52a and 52b that generate the reference voltages VREF2 and VREF3 on the basis of the reference voltage VREF1.

Figure 9:
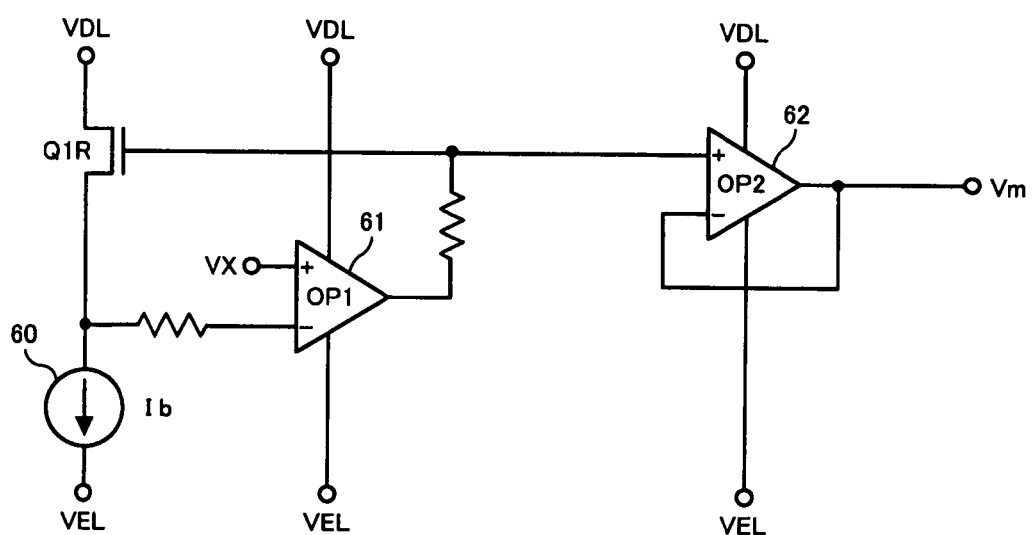
FIG. 9 is a diagram showing a circuit configuration example of a monitor part 50 of FIG. 8.

FIG. 9 shows a circuit configuration example of the monitor part 50 of FIG. 8. As shown in FIG. 9, the monitor part 50 includes a replica MOS transistor Q1R, a constant current source 60 and two operational amplifiers 61 and 62. In addition, a positive voltage VDL and a negative voltage VEL are supplied to the monitor part 50. The replica MOS transistor Q1r functions as a replica transistor of the MOS transistor Q1 (FIG. 3) to be monitored, and is formed in the approximately same shape and size as the MOS transistor Q1. A drain current flowing in the MOS transistor Q1R is equal to a bias current Ib flowing in the constant current source 60 connected to the source.

The operational amplifier 61 has a minus-side input terminal connected to the source of the replica MOS transistor Q1R via a resistor, and a plus-side input terminal receiving a potential VX. The potential VX is set to an intermediate voltage between the voltage VBLH (FIG. 4) and the voltage VBLL (FIG. 5). An output voltage of the operational amplifier 61 is inputted to the gate of the replica MOS transistor Q1R via a resistor. The subsequent operational amplifier 62 receiving the output voltage of the operational amplifier 61 forms a voltage follower so as to output the monitor voltage Vm. Thereby, a gate-source voltage of the MOS transistor Q1R in a state where the bias current Ib flows therein is extracted as the threshold voltage Vt1, and feedback control is performed so that the monitor voltage Vm matches a value obtained by adding a threshold voltage Vt1R of the replica MOS transistor Q1r to the potential Vx (Vm=VX+Vt1R). Accordingly, the monitor voltage Vm varies, reflecting process and temperature dependencies of the replica MOS transistor Q1R.

Figure 10:
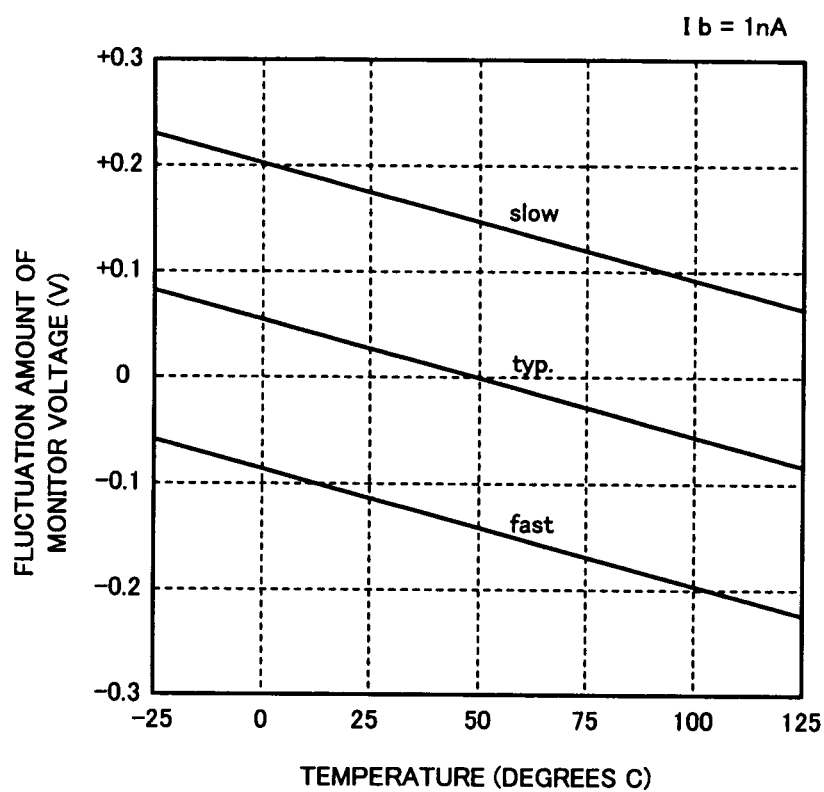
FIG. 10 is a graph showing an example of process/temperature dependency of a monitor voltage Vm outputted from the monitor part 50 of FIG. 9.

FIG. 10 is a graph showing an example of process/temperature dependency of the monitor voltage Vm outputted from the monitor part 50. In FIG. 10, three types of characteristics including a typical operation characteristic Sa (typ), a fast operation characteristic Sa (fast), and a slow operation characteristic Sa (slow) are compared corresponding to variation in manufacturing process, and each relation between the temperature and a fluctuation amount of the monitor voltage Vm is shown in the graph. In addition, the fluctuation amount of the monitor voltage Vm along a vertical axis corresponds to values obtained by a criterion in which the manufacturing process is "typ" and the temperature is 50 degrees Celsius. Further, the bias current Ib of FIG. 9 is assumed to be set to 1 nA. As shown in FIG. 10, the monitor voltage Vm decreases with a rise in temperature and also decreases with an increase in operating speed.

Figure 11:
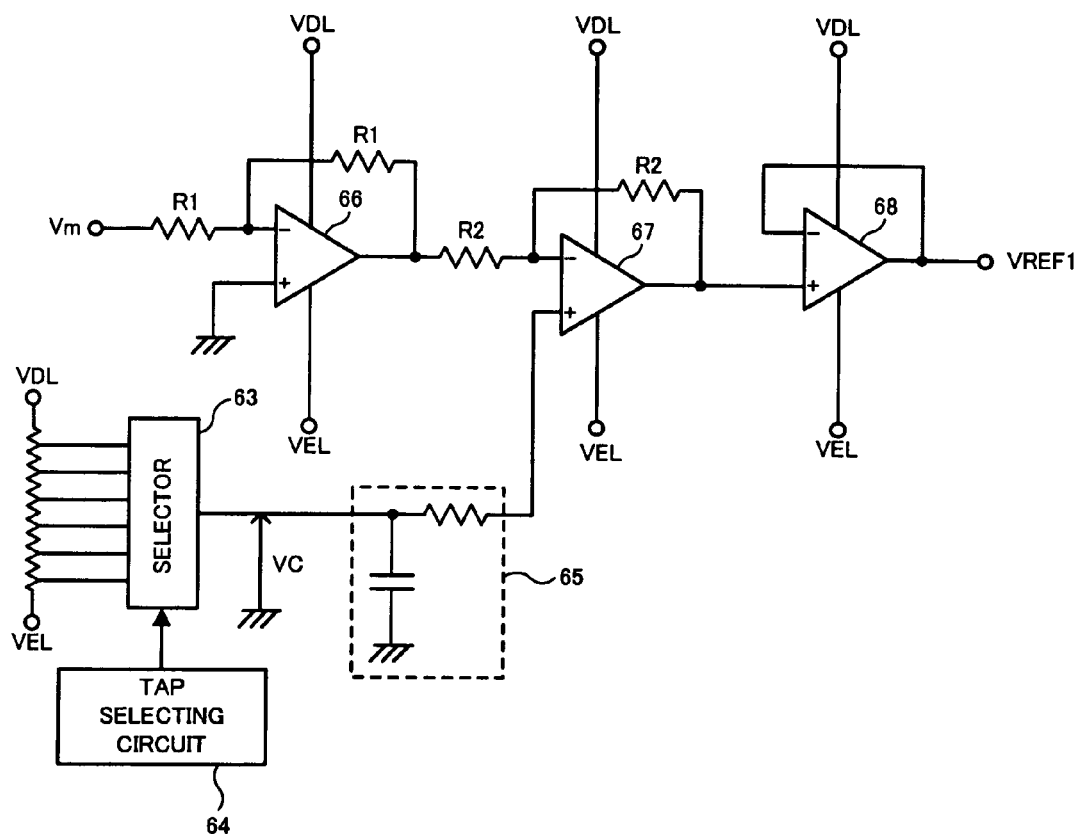
FIG. 11 is a diagram showing a circuit configuration example of a level correction part of FIG. 8.

FIG. 11 shows a circuit configuration example of the level correction part 51 of FIG. 8. As shown in FIG. 11, the level correction part 51 includes a selector 63, a tap selecting circuit 64, a low pass filter 65, and three operational amplifiers 66, 67 and 68. The selector 63 sets a desired potential selected from a large number of intermediate voltages between the positive power supply voltage VDL and the negative the power supply voltage VEL by resistive division based on correction amount information sent from the tap selecting circuit 64, and outputs the desired potential as a correction amount VC. Information of selectable intermediate voltages in the selector 63 is programmed in the tap selecting circuit 64.

The first operational amplifier 66 inverts and amplifies the monitor voltage Vm of the monitor part 50. The second operational amplifier 67 receives the above correction amount VC smoothed through the low pass filter 65 composed of a resistor and a capacitor, and a signal Vm+2VC obtained by adding a correction amount 2VC to the monitor voltage Vm is outputted from the operational amplifier 67. The third operational amplifier 68 as a driver forms a voltage follower so as to output the reference voltage VREF1 equal to Vm+2VC. Here, a value of the correction amount 2VC is set to 2VC=Vt1C−Vt1R using a value Vt1C as the center value of the distribution of the threshold voltage Vt1 of the MOS transistor Q1, which is obtained by performing a wafer test or the like. By this setting, the difference between the threshold voltage Vt1R of the replica MOS transistor Q1R and the value Vt1C can be corrected.

Figure 12:
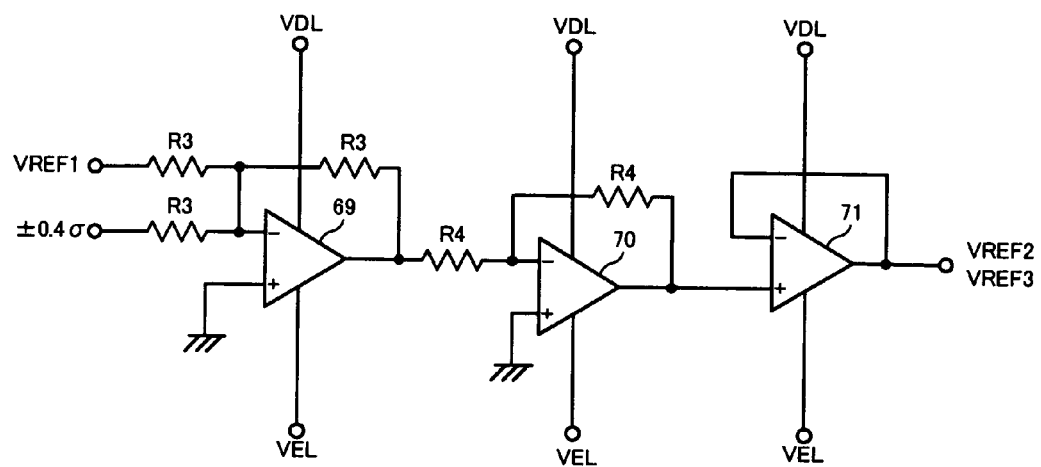
FIG. 12 is a diagram showing a circuit configuration example of voltage adding parts of FIG. 8.

FIG. 12 shows a circuit configuration example of the voltage adding parts 52a and 52b of FIG. 8. Here, the voltage adding parts 52a generating the reference voltages VREF2 and the voltage adding parts 52b generating the reference voltages VREF3 are common in circuit configuration. As shown in FIG. 12, the voltage adding parts 52a (52b) includes three operational amplifiers 69, 70 and 71. The first operational amplifier 69 adds the reference voltage VREF1 and a voltage value equivalent to +0.4σ (−0.4σ) and inverts and amplifies it. The second operational amplifier 70 further inverts and amplifies the output of the operational amplifier 69 and generates a voltage VREF1+0.4σ (VREF1−0.4σ). The third operational amplifier 71 as a driver forms a voltage follower and outputs the reference voltage VREF2 (VREF3) equal to VREF1+0.4σ (VREF1−0.4σ). Accordingly, the reference voltage VREF2 and VREF3 vary, reflecting the process and temperature dependencies of the replica MOS transistor Q1R, similarly as the reference voltage VREF1.

Figure 13:
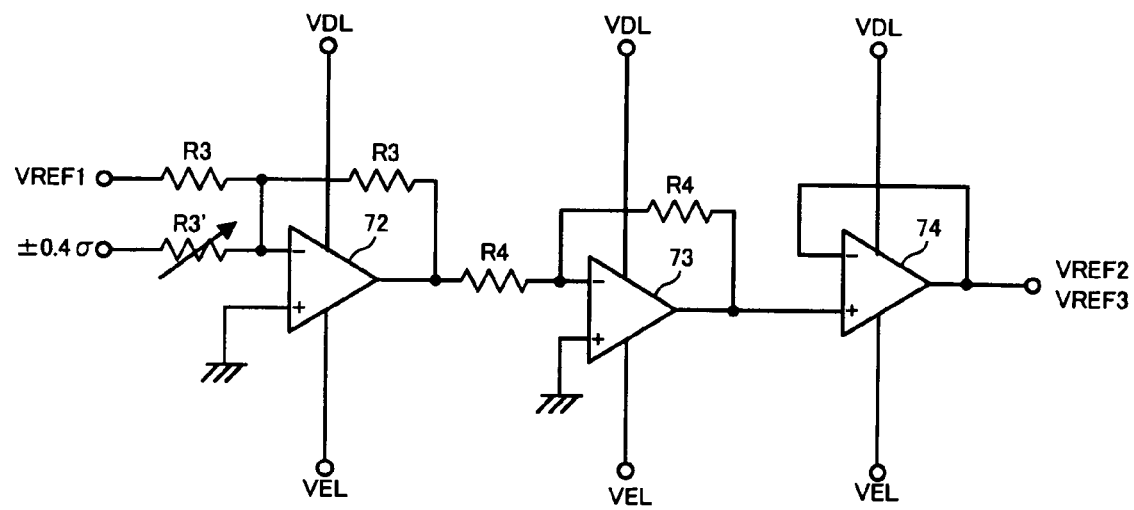
FIG. 13 is a diagram showing modification of the circuit configuration example of the voltage adding parts of FIG. 8.

Further, FIG. 13 shows a modification of the circuit configuration of the voltage adding parts 52a and 52b in FIG. 12. When comparing the modification shown in FIG. 13 with FIG. 12, a difference exists in that a resistor R3 receiving a voltage value equivalent to +0.4σ (−0.4σ) is replaced with a variable resistance R3'. Thus, it is possible to adjust a voltage value applied to an input terminal of a first operational amplifier 72. By this configuration, values of the reference voltage VREF2 and VREF3 can be adjusted in accordance with an actual fluctuation amount of the threshold voltage Vt1, thereby setting an appropriate shifting amount.

Figure 14:
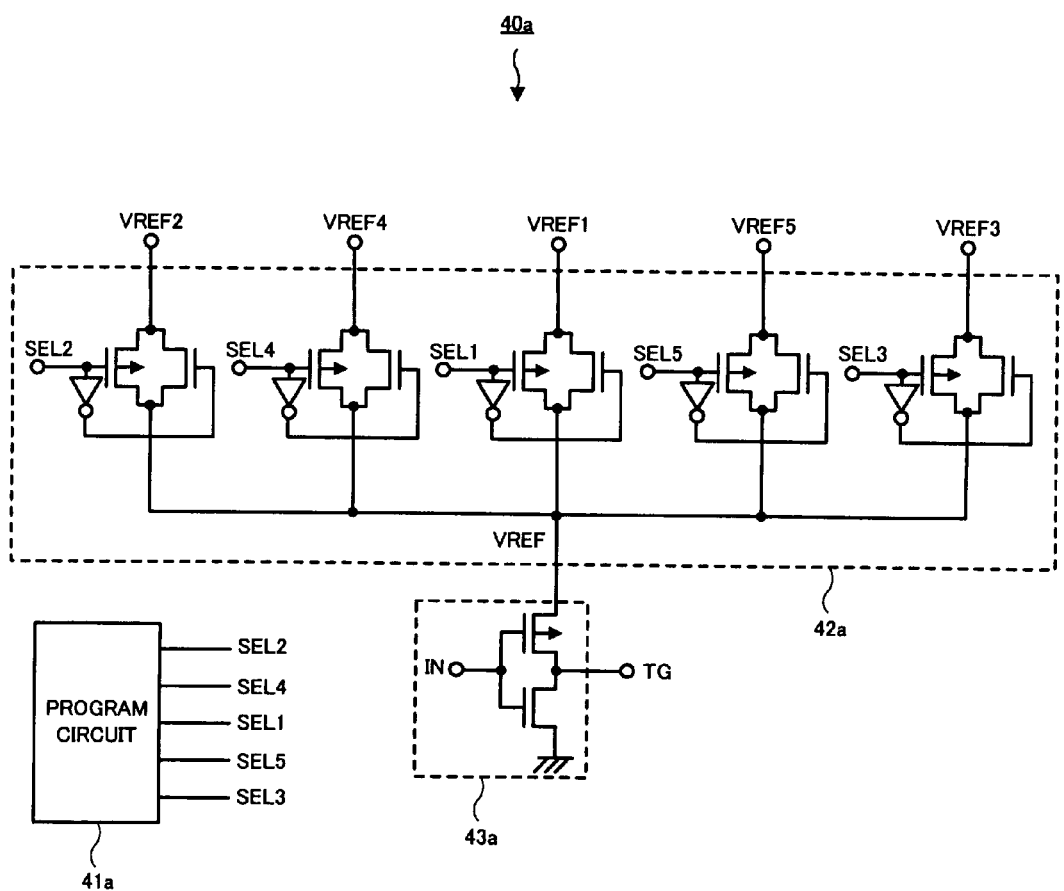
FIG. 14 is a diagram showing a modification of the TG generation circuit of FIG. 7.

In the embodiments, various modifications are available without being limited to the configurations and operations described based on FIGS. 1 to 13. FIG. 14 shows a modification of the TG generation circuit 40 of FIG. 7. The TG generation circuit 40a as the modification of FIG. 14 is provided with a configuration capable of selecting multiple reference signals in addition to the configuration of FIG. 7. That is, a reference voltage VREF4 that is an intermediate voltage between the reference voltages VREF1 and VREF2 and a reference voltage VREF5 that is an intermediate voltage between the reference voltages VREF2 and VREF3 can be selected in addition to the three reference voltages VREF1, VREF2 and VREF3. Therefore, the program circuit 41a outputs select signals SEL1, SEL2, SEL3, SEL4 and SEL5 that are activated in accordance with the selection result of the five reference voltages VREF1 to VREF5, and the select circuit 42a includes five groups of switch circuits outputting a signal selected among the input five reference voltages VREF1 to VREF5 as the reference voltage VREF in response to the select signals SEL1 to SEL5. Although the modification of FIG. 14 requires a relatively large circuit scale, it is possible to obtain an effect that an appropriate reference voltage VREF can be selected even when a larger number of sense amplifiers SA are arranged or even when the standard deviation σ becomes larger.

Figure 15:
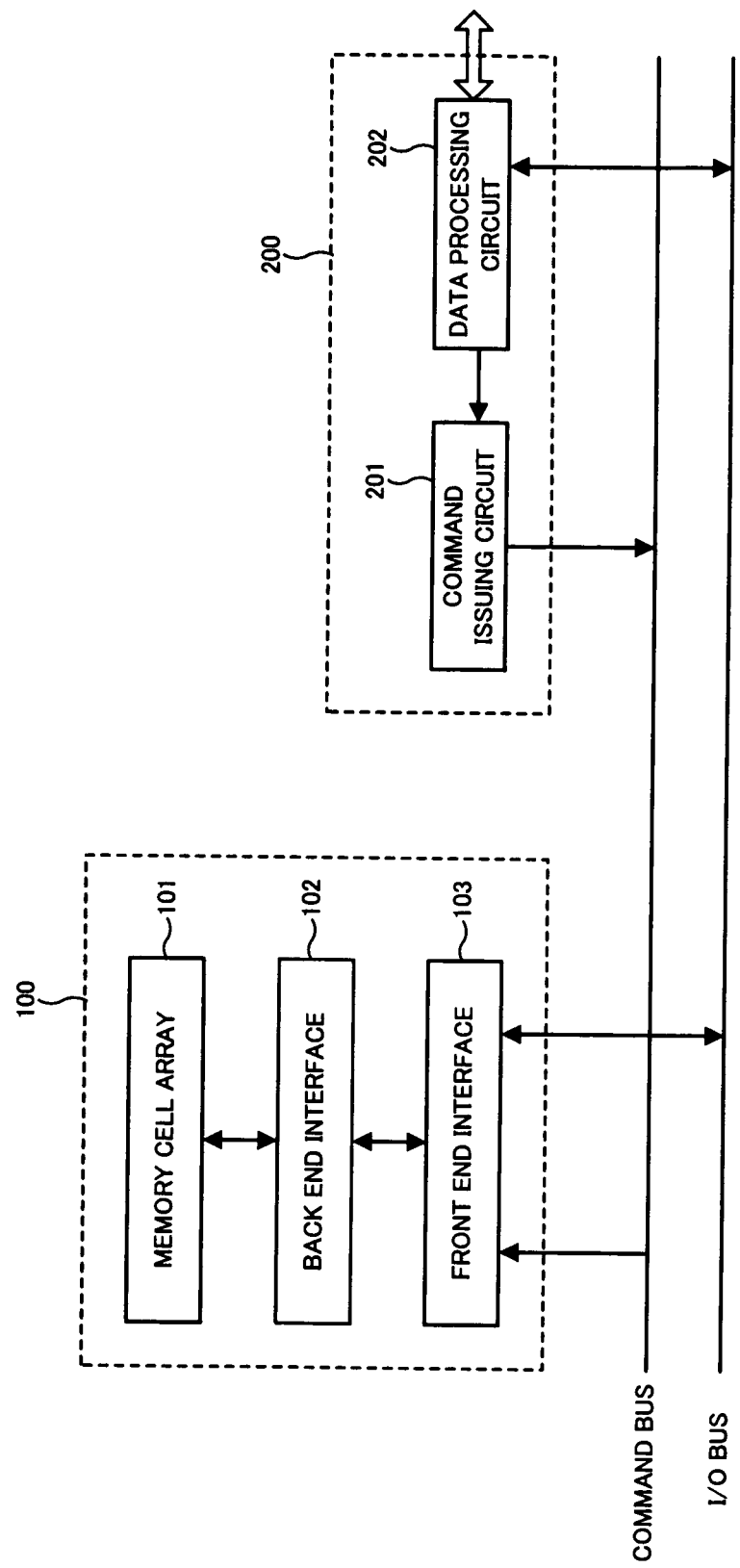
FIG. 15 is a diagram showing a configuration example of a data processing system comprising a semiconductor device having the configuration described in the embodiments and a controller controlling operations of the semiconductor device.

Next, a case in which the present invention is applied to a system comprising a semiconductor device will be described. FIG. 15 shows a configuration example of a data processing system comprising a semiconductor device 100 having the configuration described in the embodiments and a controller 200 controlling operations of the semiconductor device 100.

The semiconductor device 100 is provided with a memory cell array 101, a back-end interface 102 and a front-end interface 103. A large number of memory cells of the embodiments are arranged in the memory cell array 101. The back-end interface 102 includes the sense amplifier rows 32 and peripheral circuits thereof of the embodiments. The front-end interface 103 has a function to communicate with the controller 200 through a command bus and an I/O bus. Although FIG. 15 shows one semiconductor device 100, a plurality of semiconductor devices 100 can be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device of the embodiments may be included in the controller 200 in FIG. 15.

The data processing system of FIG. 15 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention, and the present invention obviously covers the various modifications. That is, the present invention covers the various modifications which those skilled in the art can carry out in accordance with all disclosures including claims and technical ideas.

For example, although the configuration in which the ground potential VSS is used as the reference voltage has been described in the embodiments, the present invention can be applied to a configuration in which the voltage relation is reversed so as to use the supply voltage VDD as the reference voltage. In this case, N-channel type transistors included in the circuit configuration (FIG. 3) of the embodiments may be replaced with P-channel type transistors or the like. Further, various circuit configurations can be employed for the sense amplifier SA and the like, without being limited to the configurations described in the embodiments. For example, a hierarchical single-ended bit line structure can be employed to configure the bit lines BL and the sense amplifier SA, in addition to an open bit line structure.

Further, various materials and structures can be adapted to form a field-effect transistor (FET) used as the transistors of the embodiments. For example, various types such as MIS (Metal-Insulator Semiconductor), TFT (Thin Film Transistor), and the like can be used as the FET for the transistors, in addition to MOS (Metal Oxide Semiconductor) transistor, and transistors other than FETs can be used for other transistors. Further, an N-channel type transistor (NMOS transistors) is a typical example of a first conductive type transistor, and a P-channel type transistor (PMOS transistor) is a typical example of a second conductive type transistor. Furthermore, an N-TYPE semiconductor substrate can be used other than a P-type semiconductor substrate, and also a semiconductor substrate having SOI (Silicon on Insulator) structure or other type semiconductor substrates can be used.

The present invention is not limited to the DRAM, and can be applied to various semiconductor devices having transmission lines and amplifiers connected thereto, such as CPU (Central Processing Unit), MCU (Micro Control Unit), DSP (Digital Signal Processor), ASIC (Application Specific Integrated Circuit), ASSP (Application Specific Standard Product) and the like.

The invention claimed is:
1. A semiconductor device comprising:
a bit line transmitting a signal to be sensed;
a single-ended sense amplifier including a first transistor controlling charge transfer between the bit line and an input node in response to a transfer control signal applied to a gate thereof, the sense amplifier sensing and amplifying a signal transmitted from the bit line to the input node, the transfer control signal changing between first and second logical values in association with an operation of the semiconductor device; and a reference voltage supplying circuit producing a plurality of reference voltages each having a voltage value controlled in association with a threshold voltage of the first transistor, the reference voltage supplying circuit outputting one of the reference voltages as the first logical value of the transfer control signal.

2. The semiconductor device according to claim 1, wherein the reference voltage supplying circuit supplies one reference voltage of the plurality of reference voltages that is associated with a variation distribution of threshold voltages of a plurality of the first transistors commonly to gates of the first transistors included in a plurality of the sense amplifiers.

3. The semiconductor device according to claim 2, wherein the reference voltage supplying circuit includes a reference voltage select circuit selecting the reference voltage among the plurality of reference voltages.

4. The semiconductor device according to claim 3, wherein the reference voltage select circuit selects the reference voltage among the plurality of reference voltages in accordance with preset selection information.

5. The semiconductor device according to claim 4, wherein the selection information is information that selects the reference voltage minimizing a probability that a threshold voltage of the first transistor is outside a range from a first voltage of the bit line to a second voltage of the bit line based on a variation distribution of the threshold voltage of the first transistor, the first voltage corresponding to high level data stored in a memory cell connected to the bit line and the second voltage corresponding to low level data stored in the memory cell connected to the bit line.

6. The semiconductor device according to claim 4, further comprising programming means for storing the selection information.

7. The semiconductor device according to claim 6,
wherein the reference voltage supplying circuit supplies one reference voltage of the plurality of reference voltages commonly to a predetermined number of the sense amplifiers corresponding to a predetermined number of the bit lines,
and the selection information is information indicating the reference voltage to be selected based on read test result of signals of the predetermined number of the bit lines which are read out to the predetermined number of the sense amplifiers.

8. The semiconductor device according to claim 7, further comprising a built-in self test circuit controlling the predetermined number of the sense amplifiers so as to calculate and output the selection information based on the obtained read test result.

9. The semiconductor device according to claim 3, wherein the plurality of reference voltages includes a first reference voltage corresponding to a center of the variation distribution, a second reference voltage higher than the first reference voltage, and a third reference voltage lower than the first reference voltage.

10. The semiconductor device according to claim 9, wherein the plurality of reference voltages further includes a fourth reference voltage having an intermediate voltage value between the first and second reference voltages and a fifth reference voltage having an intermediate voltage value between the first and third reference voltages.

11. The semiconductor device according to claim 3, further comprising a reference voltage generating circuit generating the plurality of reference voltages.

12. The semiconductor device according to claim 11, wherein the reference voltage generating circuit monitors the threshold voltage of the first transistor so as to generate a monitor voltage which varies reflecting process and temperature dependencies of the first transistor, and generates the plurality of reference voltages based on the monitor voltage.

13. The semiconductor device according to claim 1, wherein a predetermined number of the sense amplifiers form a sense amplifier row aligned in a same direction as an extending direction of the predetermined number of the bit lines aligned in a first direction,
and the reference voltage supplying circuit supplies the reference voltage commonly to the sense amplifiers of the sense amplifier row.

14. The semiconductor device according to claim 13, wherein a plurality of unit blocks each including the predetermined number of the bit lines and the sense amplifier row are repeatedly arranged in a second direction different from the first direction so as to form a plurality of the unit blocks,
and the plurality of reference voltages each controlled independently of one another are supplied corresponding to the plurality of unit blocks.

15. The semiconductor device according to claim 13, further comprising a memory cell array including a plurality of memory cells connected to corresponding ones of the plurality of the bit lines, wherein the plurality of memory cells are connected to the predetermined number of the sense amplifiers via the plurality of the bit lines.

16. The semiconductor device according to claim 1, wherein the sense amplifier includes a second transistor from which an output current flows in response to a potential of a gate connected to the input node.

17. The semiconductor device according to claim 16, wherein the sense amplifier includes a third transistor precharging the bit line to a first potential in response to a precharge signal applied to its gate.

18. The semiconductor device according to claim 17, wherein the sense amplifier includes a fourth transistor precharging the input node to a second potential in response to the precharge signal applied to its gate.

19. The semiconductor device according to claim 16, wherein the sense amplifier includes a fifth transistor controlling the output current of the second transistor in response to a read control signal applied to its gate.

20. The semiconductor device according to claim 19, wherein the sense amplifier includes a sixth transistor precharging an output node of the sense amplifier to a second potential in response to the precharge signal applied to its gate.

21. A data processing system comprising:
a semiconductor device comprising:
a bit line transmitting a signal to be sensed;
a single-ended sense amplifier including a first transistor controlling charge transfer between the bit line and an input node in response to a transfer control signal applied to a gate thereof, the sense amplifier sensing and amplifying the signal transmitted from the bit line to the input node; and
a reference voltage supplying circuit outputting a reference voltage having a voltage value controlled in association with a threshold voltage of the first transistor, the reference voltage being set to a first logical value of the transfer control signal controlled to be first and second logical values in association with an operation of the semiconductor device; and
a controller connected to the semiconductor device through a bus, the controller processing data stored in the semiconductor device and controlling operations of the system as a whole and an operation of the semiconductor device.

22. The data processing system according to claim 21, wherein the controller includes a command issuing circuit sending commands to the semiconductor device through the bus, and a data processing circuit sending and receiving data to and from the semiconductor device through the bus to perform processes required for the controlling.

23. A data processing system comprising:

a semiconductor device comprising:

a sense amplifier comprising first to fourth nodes and comprising a first transistor electrically switching between the first and second nodes in response to a potential of a transfer control signal and a second transistor electrically switching between the third and fourth nodes in response to a potential of the second node;

a first circuit generating the transfer control signal having first and second logical values in association with an operation of the semiconductor device; and a second circuit controlling a potential of the first logical value in association with a threshold voltage of the first transistor, the second circuit outputting the potential to the first circuit; and a controller connected to the semiconductor device through a bus, the controller processing data stored in the semiconductor device and controlling operations of the system as a whole and an operation of the semiconductor device.

24. The data processing system according to claim 23, wherein the controller includes a command issuing circuit sending commands to the semiconductor device through the bus, and a data processing circuit sending and receiving data to and from the semiconductor device through the bus to perform processes required for the controlling.

25. A semiconductor device comprising:

a bit line supplied with a signal to be sensed during a sensing period, the signal being related to data stored in a memory cell;

a first transistor coupled between the bit line and a first circuit node and including a gate;

a second transistor coupled between a voltage line and a second circuit node and including a gate coupled to the first circuit node;

a third transistor activated during a precharge period to precharge the bit line to a first precharge level;

a fourth transistor activated during the precharge period to precharge the first circuit node to a second precharge level that is different from the first precharge level; and a control circuit receiving a first level and a plurality of second levels, the control circuit being configured to supply the gate of the first transistor with the first level to turn the first transistor OFF during the precharge period and with a selected one of the second levels during the sensing period, the second levels being different from each other, and each of the second levels taking an intermediate level between first and second precharge levels.

26. The device as claimed in claim 25, wherein the control circuit comprises:

a first line supplied with the first level;

a plurality of second lines each supplied with an associated one of the second levels;

an output node coupled to the gate of the first transistor;

a fifth transistor coupled between the first line and the output node and turned ON during the precharge period;

a sixth transistor coupled between the output node and a third circuit node and turned ON during the sensing period; and a plurality of switches each coupled between the third circuit node and an associated one of the second lines, a selected one of the switches being rendered conductive at least during the sensing period.

27. The device as claimed in claim 26, wherein the control circuit further comprises a programming circuit that is programmed to render the selected one of the switches conductive.

28. The device as claimed in claim 26, wherein each of the switches comprises a transmission gate.

29. The device as claimed in claim 25, wherein each of the second levels is related to a threshold voltage of the first transistor.

30. The device as claimed in claim 29, wherein the control circuit comprises a replica transistor provided correspondingly to the first transistor, and the each of the second levels is generated in response to a threshold voltage of the replica transistor.

* * * * *